US006820232B2

(12) United States Patent
Kim et al.

(10) Patent No.: US 6,820,232 B2
(45) Date of Patent: Nov. 16, 2004

(54) DEVICE AND METHOD FOR DETECTING ERRORS IN CRC CODE HAVING REVERSE ORDERED PARITY BITS

(75) Inventors: Jae-hong Kim, Seoul (KR); Jun-jin Kong, Sungnam (KR); Sung-han Choi, Anyang (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 511 days.

(21) Appl. No.: 09/905,995

(22) Filed: Jul. 17, 2001

(65) Prior Publication Data

US 2002/0083392 A1 Jun. 27, 2002

(30) Foreign Application Priority Data

Nov. 10, 2000 (KR) ........................................ 2000-66860

(51) Int. Cl.[7] .............................................. H03M 13/00
(52) U.S. Cl. ...................................................... 714/781
(58) Field of Search ................................ 714/752, 758, 714/781, 785

(56) References Cited

U.S. PATENT DOCUMENTS

| | | | | |
|---|---|---|---|---|
| 5,157,669 A | * | 10/1992 | Yu et al. ...................... | 714/758 |
| 5,771,244 A | * | 6/1998 | Reed et al. .................. | 714/752 |
| 6,327,691 B1 | * | 12/2001 | Huang ......................... | 714/781 |
| 6,493,844 B1 | * | 12/2002 | Kanasugi et al. ........... | 714/781 |
| 6,609,225 B1 | * | 8/2003 | Ng .............................. | 714/781 |

FOREIGN PATENT DOCUMENTS

| | | |
|---|---|---|
| JP | 4-150631 | 5/1992 |
| WO | WO 82/01094 A1 | 4/1982 |

OTHER PUBLICATIONS

Japanese Abstract No. 4–150631, dated May 25, 1992.
Japanese Abstract No. 2000–269826, dated Sep. 29, 2000.
NTT DOCOMO: "CRC position—TSGR1#5(99)689" 3GPP Meeting Documents, Jun. 1, 1999, pp. 1–5, XP002230390.

* cited by examiner

*Primary Examiner*—Albert Decady
*Assistant Examiner*—Shelly A Chase
(74) *Attorney, Agent, or Firm*—Sughrue Mion, PLLC

(57) ABSTRACT

A device for detecting in a receiver whether any transmission errors have occurred in the received CRC code, in a case that a transmitter transmits the CRC code created by sequencing the parity bits, which are generated using the generator polynomial, in the reverse order and appending them to the message bits. The device comprises a division unit for dividing the message bits by the parity bit generator polynomial to form the remainder, a comparison unit for bitwise comparing the remainder bits with the reverse ordered parity bits, and a decision unit for deciding whether transmission errors have occurred in the CRC code based on the results of the comparison unit. According to the present invention, the transmission errors in the received CRC code are effectively detected, when the CRC code includes the parity bits sequenced in the reverse order, unlike the conventional normal order.

14 Claims, 4 Drawing Sheets

DEVICE AND METHOD FOR DETECTING ERRORS IN CRC CODE HAVING REVERSE ORDERED PARITY BITS

BACKGROUND OF THE INVENTION

1. Field of the Invention

The present invention relates to a device and method for detecting errors in a CRC (Cyclic Redundancy Check) code, and more particularly to a device and method for detecting in a receiver any transmission errors in the CRC code, in a case that a transmitter transmits the CRC code generated by sequencing the parity bits, which are generated by using a generator polynomial in the reverse order, unlike the conventional manner, and by appending them to the message bits. The present application is based on Korean Patent Application No. 2000-66860, which is incorporated herein by reference.

Digital communication systems often use a method that adds the parity bits to the information bearing message bits to be transmitted in order to allow the receiver to detect transmission errors. In the receiver, the parity bits are checked alone or together with the message bits to determine whether transmission errors have occurred. Among the error detection methods using such parity bits, the CRC method is known as the most powerful method.

2. Description of the Related Art

FIG. 1 illustrates the structure of the conventional CRC (Cyclic Redundancy Check) code. Referring to FIG. 1, n bits of CRC code comprise k message bits ($m_{k-1} \sim m_0$) and n-k parity bits ($p_{n-k-1} \sim P_0$).

The CRC code can be represented by a certain polynomial, and the parity bits can also be represented by a polynomial using the remainder polynomial of the message bit polynomial divided by the generator polynomial.

The polynomial representation of the k message bits is $$m(X)=m_0+m_1X^1+m_2X^2+\ldots+m_{k-1}X^{k-1}$$

and, the polynomial representation of the generator polynomial for generating the parity bits is $$g(X)=g_0+g_1X^1+g_2X^2+\ldots+g_{n-k}X^{k-1}$$

and, the polynomial representation of the n-k parity bits is $$p(X)=P_0+p_1X^1+p_2X^2+\ldots+P_{n-k-1}X^{n-k-1}$$

Then, the CRC code can be expressed by $$c(X)=X^{n-k}m(X)+p(X)$$

where, $p(X)=X^{n-k}m(X) \bmod g(X)$.

Such a CRC code method for detecting whether transmission errors have occurred divides the received CRC code by the generator polynomial and detects whether the remainder of the division is zero. This method for detecting transmission errors of the CRC code can be proved by the following equations.

As stated above, since p(X) is the remainder of $X^{n-k}m(X)$ divided by g(X), the following equation can be defined.

$$X^{n-k}m(X)=g(X)Q(X)+p(X)$$

Transposing p(X) to the left side, we have $$X^{n-k}m(X)-p(X)=g(X)Q(X).$$

Here, since "−p(X)" equals "+p(X)" in the operations in the binary Galois Field unlike the general operations, $$X^{n-k}m(X)+p(X)=g(X)Q(X).$$

In the above equation, since the left side equals c(X), the quotient and the remainder of c(X) divided by g(X) are Q(X) and "0," respectively. FIG. 2 illustrates a conventional device for detecting CRC code error using the stated principle. Referring to FIG. 2, the related device comprises a division unit 11 for dividing the received CRC code by the generator polynomial and a decision unit 13 for deciding the occurrence of errors by using the outputs from the division unit 11. The division unit 11 comprises n−k one bit registers 11a, n−k multipliers 11b, and n−k exclusive-OR gates 11c. The decision unit 13 comprises a NOR gate 13a for NOR operation on the outputs from the registers 11a of the division unit 11.

When a transmitter in the digital communication system transmits the CRC code bits ($m_{k-1}$, $m_{k-2}$, ..., $m_0$, $P_{n-k-1}$, ..., $p_0$) having the structure shown in FIG. 1, the CRC code bits that have passed a proper channel are input to the registers 11a sequentially and each of the CRC code bits in the registers are shifted one position from left to right with every input. And, the multipliers 11b multiply the CRC code bits sequentially transferred via the right most register 11a by coefficient signal $g_0$, $g_1$, $g_2$, ..., $g_{n-k-1}$ of the generator polynomial, and each of the X-OR gates 11c performs bitwise exclusive OR operation on each resultant bit from each of the multipliers 11b and each of the CRC code bits that is subsequently input. After all the n bits are input to the registers 11a and processed by the aforementioned operations, the final remainder of the CRC code divided by the generator polynomial remain in the registers 11a. If no transmission errors have occurred, all the resultant contents of the registers 11a become "0s." Thus, the decision unit 13a for performing NOR operations on the n−k input bits from the registers 11a provides an output "1," only if the CRC code has no transmission errors. On the other hand, if the result of the entire NOR operations is "0," the decision unit 13a decides that the CRC code has transmission errors.

Recently, a new method to generate the CRC code using the parity bits differently from the aforementioned method was suggested as a data transmission method in the Universal Mobile Telecommunication System (UMTS) related to the next generation mobile telecommunication, called an IMT-2000. That is, the UMTS adopts a new method for using the parity bits generated by sequencing the remainder bits of the message bits divided by the generator polynomial in the reverse order, unlike the conventional technique.

The new method will be explained in detail in the following.

FIG. 3 illustrates a structure of the CRC code in which the parity bits are added in the reverse order. The CRC code is transmitted in a sequence of $m_{k-1}$, $m_{k-2}$, ..., $m_0$, $p_0$, ..., $p_{n-k-1}$. The CRC code can be expressed by a polynomial $$c(X)=X^{n-k}m(X)+p^{\perp}(X)$$

where, taking $p(X)=X^{n-k}m(X) \bmod g(X)$, $p^\perp(X)$ is defined as $$p^\perp(X)=X^{\deg\,p(X)}p(X^{-1}).$$

However, the conventional error detection device can detect errors only in the conventional CRC code in which the parity bits are added in the normal order as illustrated in FIG. 1. The conventional error detection device cannot detect transmission errors in the new CRC code in which the parity bits are added in the reverse order as illustrated in FIG. 3, because the remainder of the new CRC code polynomial c(X) divided by the generator polynomial g(X) does not become "0" in the conventional device. Accordingly, a need exists for detecting the transmission errors in the CRC code having the reverse ordered parity bits.

SUMMARY OF THE INVENTION

The object of the present invention is to provide a device and method for detecting transmission errors of the received CRC code in which a parity bit stream is added in reverse order.

In accordance with one aspect of the present invention to accomplish the object, there is provided a device for detecting errors in the CRC code comprising a switch unit for sequentially receiving the CRC code having message bits and reverse ordered parity bits appended to the message bits and for switching the message bits and the parity bits to be transferred separately; a division unit for receiving the message bits transferred via said switch unit and for dividing the message bits by a parity bit generator polynomial to obtain a remainder; a buffer unit for receiving the parity bits transferred via said switch and for buffering the parity bits sequentially; a comparison unit for comparing the remainder bits from said division unit with the parity bits from said buffer unit; and a decision unit for deciding whether transmission errors have occurred in the CRC code on the basis of the results from said comparison unit.

The comparison unit preferably comprises a plurality of X-OR gates for comparing the remainder bits with the parity bits.

In another aspect of the present invention, there is provided a method for detecting errors in the CRC code comprising the steps of receiving CRC code having message bits and reverse ordered parity bits appended to the message bits; dividing the message bits by a parity bit generator polynomial to form a remainder; buffering the parity bits sequentially; comparing the remainder bits with the sequentially buffered parity bits; and deciding whether transmission errors have occurred in the received CRC code on the basis of the results from said step of comparing.

In another aspect of the present invention, there is provided a device for detecting errors in the CRC code comprising a switch unit for sequentially receiving the CRC code having message bits and reverse ordered parity bits appended to the message bits and for switching the message bits and the parity bits to be transferred separately; a division unit for receiving the message bits transferred via said switch unit and for dividing the message bits by a parity bit generator polynomial to form a remainder and for sequentially outputting the remainder bits in the reverse order; a comparison unit for comparing the remainder bits received sequentially from said division unit with the parity bits transferred sequentially via said switch unit; and a decision unit for deciding whether transmission errors have occurred in the received CRC code on the basis of the results from said comparison unit.

The division unit preferably comprises a plurality of one bit registers serially coupled with each other for storing the remainder bits of the message bits divided by the generator polynomial; a plurality of forward shift switches for being switched to enable forward shifting of said plurality of registers until the last message bit input from said switch unit passes through said plurality of registers; and a plurality of backward shift switches for being switched to enable backward shifting of said plurality of registers so that the remainder bits stored in said plurality of registers are provided to said comparison unit sequentially.

In another aspect of the present invention, there is provided a method for detecting errors in the CRC code comprising the steps of receiving CRC code having message bits and reverse ordered parity bits appended to the message bits; dividing the message bits by a parity bit generator polynomial to form a remainder and for sequentially outputting the remainder bits in the reverse order; comparing the sequentially received reverse ordered remainder bits with the sequentially received parity bits; and deciding whether transmission error has occurred in the received CRC code on the basis of the results from said step of comparing.

In another aspect of the present invention, there is provided a device for detecting errors in the CRC code comprising a division unit that receives and shifts input CRC code sequentially by using a plurality of one bit registers, wherein said input CRC code comprises message bits and reverse ordered parity bits appended to the message bits, and divides the message bits by a parity bit generator polynomial to form a remainder, and stores the remainder bits in said plurality of one bit registers; a comparison unit for comparing symmetrically paired two counterpart bits, from the two outermost bits to two innermost bits, of the remainder sequence stored in said plurality of registers with each other; and a decision unit for deciding whether transmission error has occurred in the input CRC code on the basis of the results from said comparison unit.

The comparison unit preferably comprises a plurality of X-OR gates, the number of which is as many as the integer part of the quotient of the division of the number of said plurality of registers by 2. If the number of said plurality of registers is odd, the center bit of the remainder stored in the center register of said plurality of registers is input directly to the decision unit.

In another aspect of the present invention, there is provided a method for detecting errors in the CRC code comprising the steps of receiving the input CRC code sequentially, wherein said input CRC code comprises message bits and reverse ordered parity bits appended to the message bits, and dividing the message bits by a parity bit generator polynomial to form a remainder; comparing symmetrically paired two counterpart bits, from the two outermost bits to the two innermost bits, of the remainder bits sequence with each other; and deciding whether transmission error has occurred in the input CRC code on the basis of the results from said step of comparing.

DETAILED DESCRIPTION OF THE PREFERRED EMBODIMENT

Figure 1:
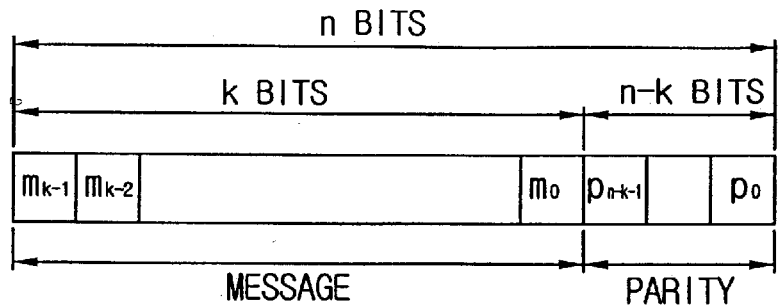
FIG. 1 is a schematic diagram showing the structure of the conventional CRC code bit stream.
Figure 2:
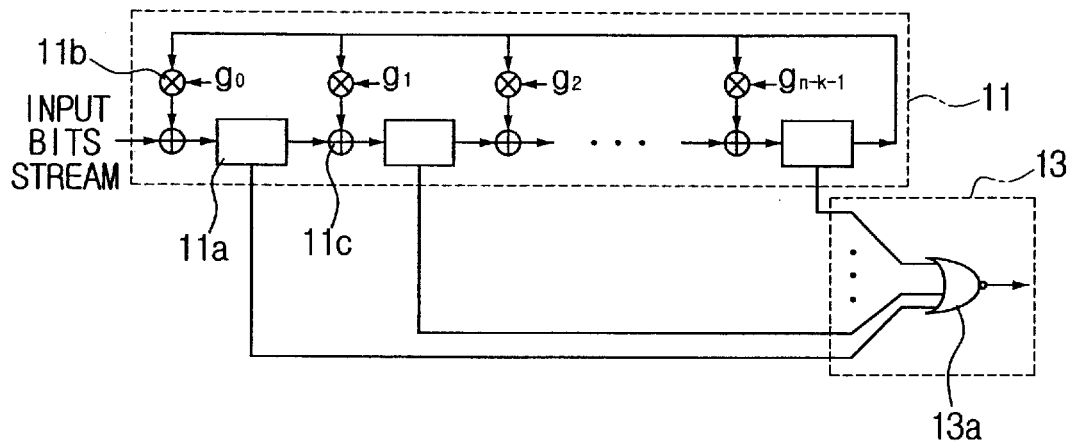
FIG. 2 is a schematic diagram showing the configuration of a conventional device for detecting errors in the CRC code as shown in FIG. 1.

The preferred embodiments of the present invention will now be described with reference to the accompanying drawings. Similar reference numerals are used for the similar elements in the following description.

Figure 3:
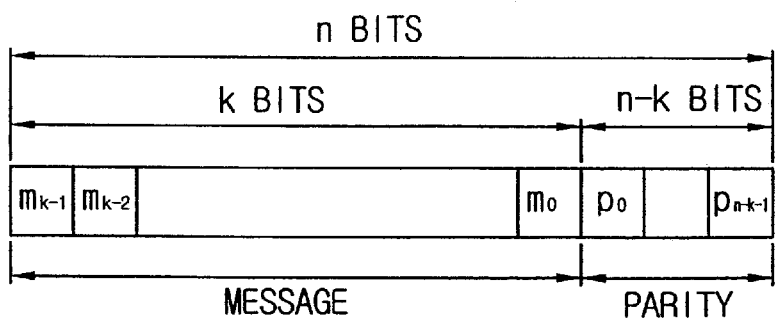
FIG. 3 is a schematic diagram showing the structure of a CRC code bit stream in which the parity bits are appended to the message bits in the reverse order.

As described above, referring to FIG. 3, the CRC code comprises the message bits and the parity bits appended to the message bits. The parity bits are constituted by the reverse ordered remainder bits of the message bits divided by a certain generator polynomial.

Figure 4:
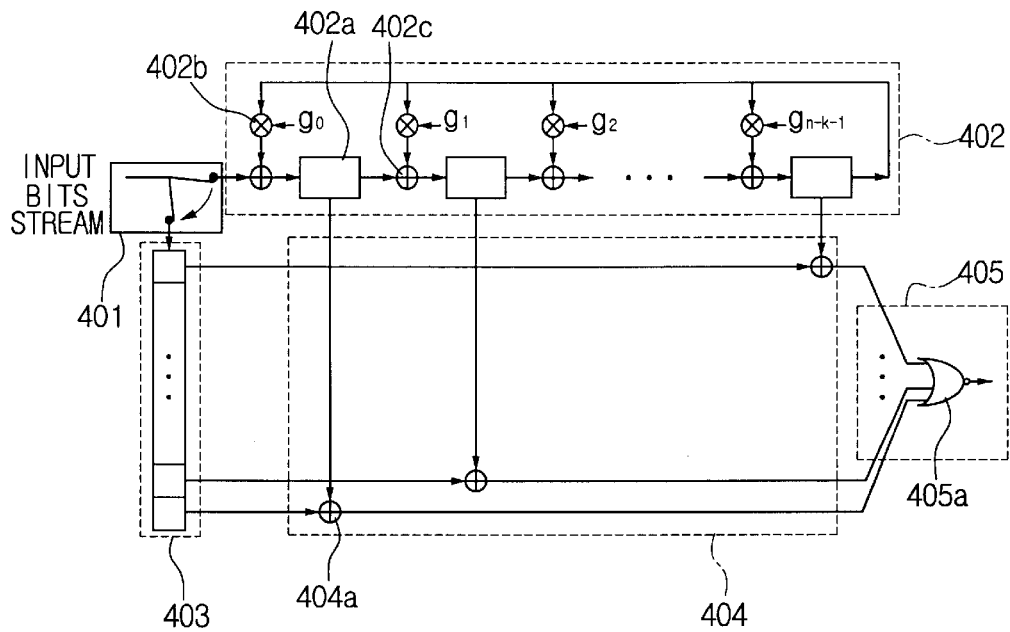
FIG. 4 is a schematic diagram showing the configuration of a device for detecting errors in the CRC code having the reverse ordered parity bits as shown in FIG. 3 according to a first embodiment of the present invention.

FIG. 4 is a schematic diagram showing the configuration of a device for detecting errors in the CRC code according to a first embodiment of the present invention. Referring to FIG. 4, the device for detecting errors in the received CRC code comprises a division unit 402 for dividing the input message bits by a parity bit generator polynomial and for storing the remainder bits of the division, a buffer unit 403 for buffering the input parity bits, a switch unit 401 for selectively switching the input CRC code between the division unit 402 and the buffer unit 403, a comparison unit 404 for comparing the output of the division unit 402 with the parity bits contained in the buffer unit 403, and a decision unit 405 for deciding whether transmission errors have occurred in the CRC code on the basis of the results of the comparison unit 404.

The switch unit 401 switches the CRC code to the division unit 402 during the input period of the message bits. On the other hand, the switch unit 401 switches the CRC code to the buffer unit 403 during the input period of the parity bits.

The division unit 402 comprises n–k one bit registers 402a, n–k multipliers 402b, and n–k exclusive-OR gates 402c. According to the switching operation of the switch unit 401, the message bits are input to the division unit 402 sequentially during the input period of the message bits of the CRC code. The input message bits are input to the registers 402a sequentially by shifting the contents of each of the registers 402a one position from left to right with every input.

While the message bits are input to the division unit 402, the division unit 402 divides the message bits by the generator polynomial. The messages, i.e., the input message bits are multiplied by the generator polynomial in the multipliers 402b and then the results are exclusive-ORed by the X-OR gates 402c so that the division operation is performed. The remainder of the division is stored in the registers 402a. The MSB (Most Significant Bit) of the remainder is stored in the right most register 402a, while the LSB (Least Significant Bit) of the remainder is stored in the left most register 402a.

After all the message bits are input to the division unit 402, the switch unit 401 switches the input CRC code to the buffer unit 403 to store the input parity bits in the buffer unit 403 sequentially. The buffer unit 403 comprises the n–k one bit registers, i.e., as many as the number of the parity bits. Each register in the buffer unit 403 stores one parity bit.

The comparison unit 404 comprises a plurality of X-OR gates (exclusive-OR gates) 404a that each performs bitwise X-OR operation on the respective remainder bit output from the division unit 402 and the one corresponding parity bit stored in the buffer unit 403. The number of the X-OR gates 404a is n–k, which is equal to the number of parity bits. Each of the X-OR gates 404a has an input from one of the registers 402a of the division unit 402 and the other input from one of the registers of the buffer unit 403. The first input parity bit among the parity bit stream is compared with the LSB of the remainder output from the division unit 402, while the last input parity bit among the parity bit stream is compared with the MSB of the remainder output from the division unit 402. Thus, the reverse ordered parity bits are compared with the remainder bits output from the division unit 402.

Since the parity bits are originally generated in the CRC code transmit side by dividing the message bits by the generator polynomial, the received CRC code in the receiving side is divided again by the generator polynomial to produce the remainder and the remainder is compared with the reverse ordered parity bit stream to detect transmission errors. That is, transmission errors in the CRC code are detectable by bitwise comparing the outputs stream from the division unit 402 with the reverse ordered contents stream of the buffer unit 403. If no transmission errors have occurred in the CRC code, all the X-OR gates 404a in the comparison unit 404 output "0s."

The decision unit 405 comprises a NOR gate 405a having a plurality of inputs from the comparison unit 404. Accordingly, only if all the X-OR gates 404a output "0," the decision unit 405 outputs "1" to indicate an error-free CRC code.

According to the aforementioned embodiment, during the message bits input period, the division operation for dividing the message bits by the generator polynomial is performed to form the remainder bits, and during the parity bits input period, the input parity bits are stored and compared in the reverse order with the remainder bits. And, if the compared two bit streams are the same, it is decided that no transmission error has occurred in the received CRC code. Therefore, it is detectable whether the transmission errors have occurred in the received CRC code comprising the reverse ordered parity bits.

Figure 5:
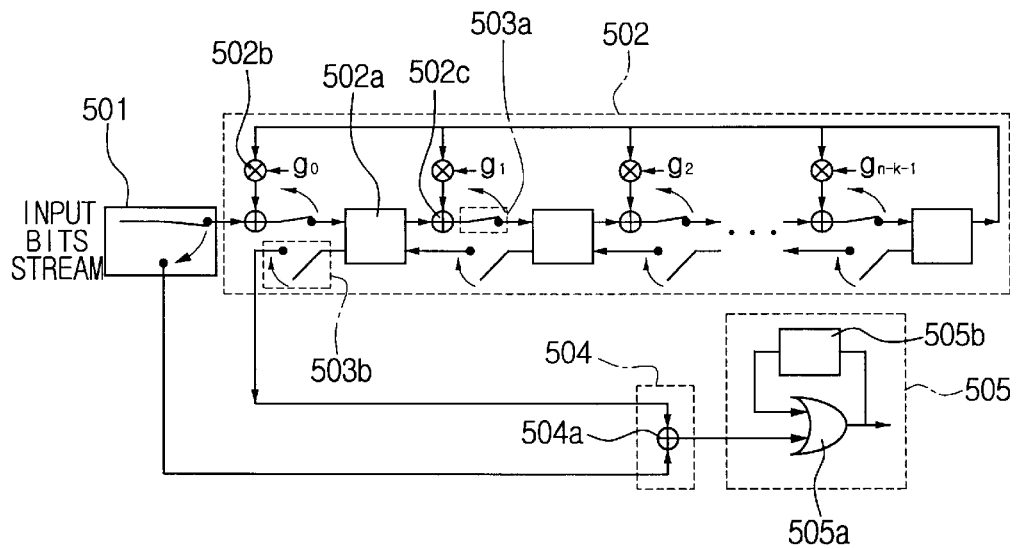
FIG. 5 is a schematic diagram showing the configuration of a device for detecting errors in the CRC code having the reverse ordered parity bits according to a second embodiment of the present invention.

FIG. 5 is a schematic diagram showing the configuration of a device for detecting errors in the CRC code according to a second embodiment of the present invention. In the second embodiment, the error detection device comprises a division unit 502 for dividing the input message bits by a parity bit generator polynomial and for outputting the remainder of the division, a comparison unit 504 for bitwise comparing the sequentially output remainder bits from the division unit 502 with the sequentially input parity bits on the bit-by-bit basis, a switch unit 501 for selectively switching the input CRC code to the division unit 502 and to the comparison unit 504, and a decision unit 505 for deciding whether transmission errors have occurred in the CRC code based on the results of the comparison unit 504.

The division unit 502 comprises n−k one bit registers 502a, n−k multipliers 502b, n−k forward shift switches 503a, n−k backward shift switches 503b, and n−k X-OR gates (exclusive-OR gates) 502c. The registers 502a are serially coupled with each other and each of the registers 502a stores the one remainder bit output from the division unit 502. During the input period of the message bits, the message bits are input to the division unit 502 sequentially according to the switching operation by the switch unit 501. The input message bits are input to the registers 502a sequentially and shifted one position from left to right.

While the message bits are input to the division unit 502, the division unit 502 divides the message bits by the generator polynomial. The division operation is similar to the aforementioned division operation referring to FIG. 4. Accordingly, the final remainder bits of the division are stored in the registers 502a. Particularly, the MSB (Most Significant Bit) of the remainder is stored in the right most register, while the LSB (Least Significant Bit) of the remainder is stored in the left most register.

When the final remainder bits are stored in the registers 502a, respectively, each of the contents of the registers 502a shifts one position left sequentially at every clock signal, and the shifted out bits are sequentially input to the comparison unit 504.

The switch unit 501 is switched to input the CRC code to the division unit 502 during the message bits input period. On the other hand, the switch unit 501 is switched to input the CRC code to the comparison unit 504 during the parity bits input period.

The switch unit 501 co-operates with the forward shift switches 503a and the backward shift switches 503b. Specifically, while the switch unit 501 switches the message bits to the division unit 502, all the forward shift switches 503a are set to an ON state and all the backward shift switches 503b are set to an OFF state. On the other hand, while the switch unit 501 switches the parity bits to the comparison unit 504, all the forward shift switches 503a are set to an OFF state and all the backward shift switches 503b are set to an ON state. While the message bits are input to the division unit 502, the division unit 502 divides the message bits by the generator polynomial. After completing the input of the message bits, the remainder bits of the division are stored in the registers 502a of the division unit 502. And, while each of the parity bits is sequentially input to the comparison unit 504, each of the remainder bits stored in the registers 502a in the division unit 502 is sequentially input to the comparison unit 504 in the reverse order. Accordingly, the reverse ordered remainder bits are sequentially compared with the parity bits on the bit-by-bit basis.

The comparison unit 504 comprises an X-OR gate (exclusive-OR gate) 504a having the two input terminals, one for the remainder bits shifted out through the last backward shift switch 503b and the other for parity bits input via the switch unit 501. Thus, the comparison unit 504 compares the reverse ordered remainder bits with the sequentially input parity bits, and outputs "1" only if the two bit streams are the same.

The decision unit 505 comprises an OR gate 505a and a delay register 505b. The output from the comparison unit 504 is input to the OR gate 505a, and the output from the OR gate 505a is stored in the delay register 505b and is input back to the OR gate 505a after one clock period. Thus, only if the X-OR gate 504a in the comparison unit 504 outputs "0s" continuously, the output of the decision unit 505 becomes "0" to indicate error-free CRC code.

According to the aforementioned embodiment, during the message bits input period, the message bits are divided by the generator polynomial to form the remainder, and during the parity bits input period, the input parity bits are compared with the reverse ordered remainder bits sequentially. Therefore, it is detectable whether transmission errors have occurred in the received CRC code including the reverse ordered parity bits.

Figure 6:
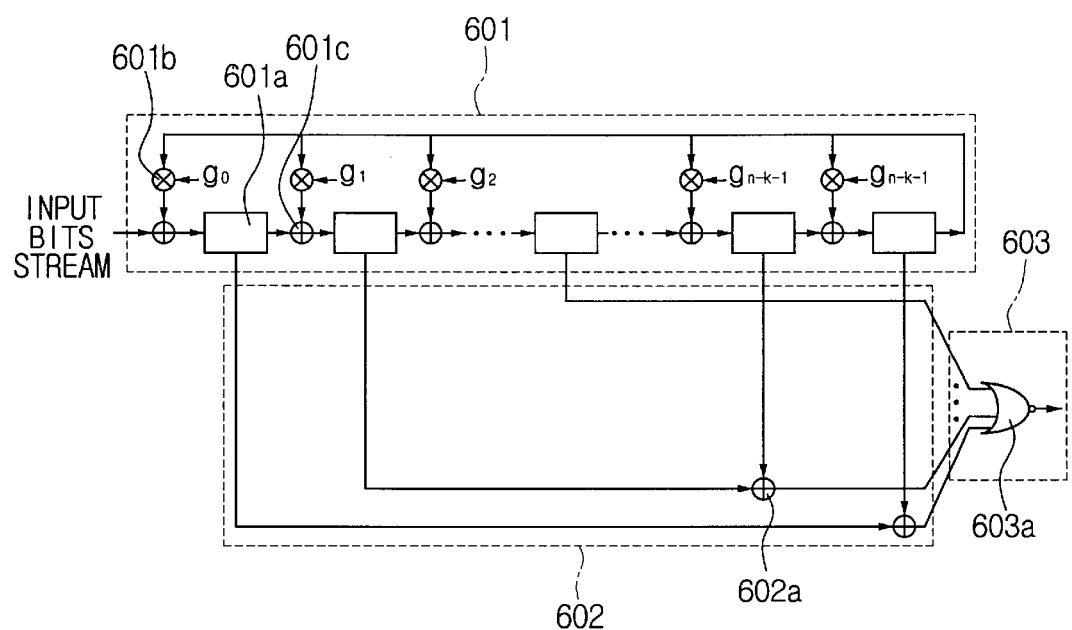
FIG. 6 is a schematic diagram showing the configuration of a device for detecting errors in the CRC code having the reverse ordered parity bits according to third embodiment of the present invention.

FIG. 6 illustrates the configuration of a device for detecting errors in the CRC code according to a third embodiment of the present invention. In the third embodiment, the error detection device comprises a division unit 601 for dividing the input message bits by the generator polynomial and for storing the remainder bits of the division in the registers 601a, respectively, a comparison unit 602 for comparing from the two outermost bits of the final remainder bits stored in the registers 601a with each other to the two innermost bits of the remainder bits with each other, and a decision unit 603 for deciding whether transmission errors have occurred in the CRC code based on the results of the comparison unit 602.

Referring to FIG. 6, the division unit 601 comprises n−k registers 601a, n−k multipliers 601b, n−k X-OR gates (Exclusive-OR gates) 601c.

The operations of the elements are similar with those of the aforementioned embodiments. However, in the third embodiment, the whole CRC code bits including the message bits and the parity bits are input to the division unit 601. Accordingly, the division unit 601 divides the whole CRC code by the generator polynomial and stores the remainder of the division in the registers 601a.

Figure 7:
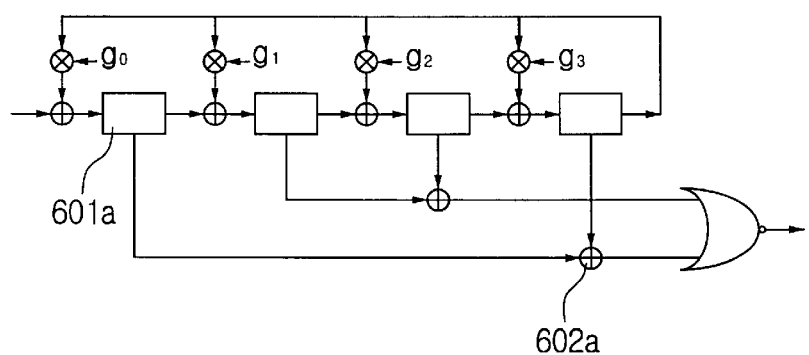
FIGS. 7 is a schematic diagram showing an exemplary mode of the device of FIG. 6, when the number of the remainder bits of the division is even.

The comparison unit 602 comprises a plurality of X-OR gates 602a, the number of which is as many as the integer part of the quotient of the division of the number of the registers 601c by 2. For example, if the division unit 601 has 4 registers 601a as illustrated in FIG. 7, the comparison unit 602 is provided with 2 X-OR gates 602a. If the division unit 601 has 3 registers 601a as illustrated in FIG. 8, the comparison unit 602 is provided with 1 X-OR gate 602a.

The inputs of each X-OR gate 602a are determined in the following manner. That is, two symmetrically counterpart bits of the final remainder bits, i.e., from the two outermost bits of the final remainder bits to the two innermost bits of the remainder bits, are paired, and the respectively paired two bits are compared with each other. In other words, the MSB, i.e., the right most bit of the remainder is compared with the LSB, i.e., left most bit of the remainder. Similarly, the second right most bit of the remainder is compared with the second left most bit of the remainder. Accordingly, the symmetrically paired two bits are input to each X-OR gate 602a in pair. And, all the outputs from the X-OR gates 602a in the comparison unit 602 are input to the decision unit 603.

Figure 8:
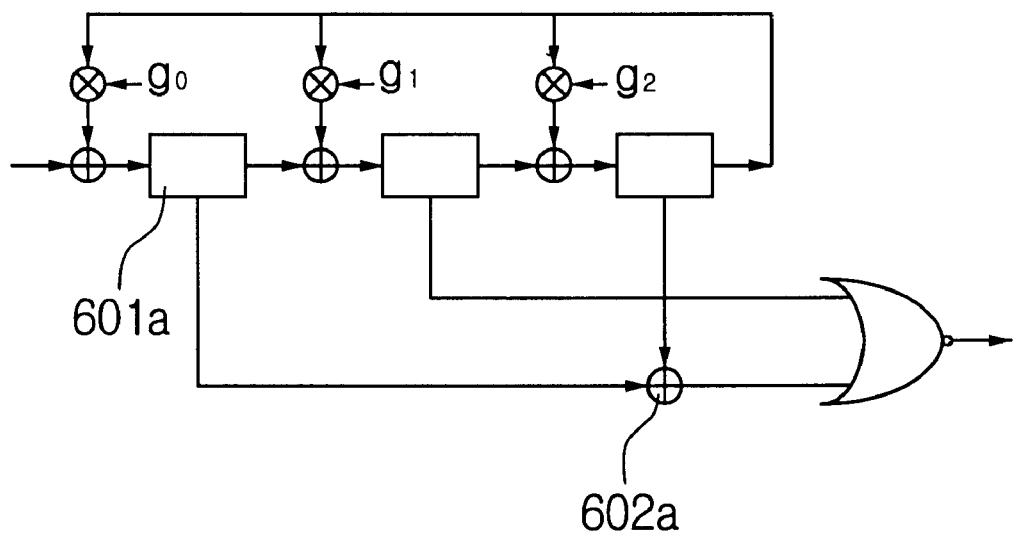
FIGS. 8 is a schematic diagram showing another exemplary mode of the device of FIG. 6, when the number of the remainder bits of the division is odd.

Meanwhile, if the number of the registers 601a is odd, the center bit of the remainder stored in the center register 601a is further input to the decision unit 603 directly as illustrated in FIG. 8.

The decision unit 603 comprises a NOR gate 603a. If the number of the registers 601a is even as illustrated in FIG. 7, the NOR gate 603a has a plurality of inputs from all the X-OR gates 602a of the comparison unit 602. If the number of the registers 601a is odd as illustrated in FIG. 8, the NOR gate 603a has an additional input from the center register 601a as well as the inputs from all the X-OR gates 602a of the comparison unit 602.

If all the inputs of the decision unit 603 are "0," then the received CRC code is error free and a "1" is output from the NOR gate 603a in the decision unit 603.

A more detailed description of the CRC code algorithm according to the embodiments of the present invention is provided below.

As stated earlier, the polynomial representation of the CRC code having the reverse ordered parity bits is $$c(X)=X^{n-k}m(X)+p^{\perp}(X)$$

where, taking $p(X)=X^{n-k}m(X) \bmod g(X)$, $p^{\perp}(X)$ is defined as $$p^{\perp}(X)=X^{\deg\ p(X)}p(X^{-1}).$$

Where, $X^{n-k}m(X) \bmod g(X)=p(X)$ and $p^{\perp}(X) \bmod g(X)=p^{195}(X)$, (∵ deg $p^{\perp}(X)$<deg g(X)).

Thus, $$\begin{aligned}c(X) \bmod g(X) &= p(X) + p^{\perp}(X)\\ &= (p_0 + p_{n-k-1}) + (p_1 + p_{n-k-2})X + \ldots + \\ &\quad (p_{n-k-2} + p_1)X^{n-k-2} + (p_{n-k-1} + p_0)X^{n-k-1}\end{aligned}$$

From the last equation, it is seen that the coefficients of the remainder polynomial of the CRC code polynomial c(x) divided by generator polynomial g(x) are formed symmetrically. Thus, if splitting the remainder bit stream in halves, and bitwise comparing the one half bit stream with the other half bit stream after sequencing the bits of the other half stream in the reverse order, then every two inputs coupled to each of the X-OR gates 602a must be the same as long as no transmission error has occurred in the received CRC code. Thus, all the X-OR gates 602a output "0" and accordingly the decision unit 603 outputs "1" to indicate error free CRC code.

Meanwhile, as illustrated in FIG. 8, if the number of the remainder bits of the c(x) divided by g(x) is odd, it is seen from the last equation that the coefficient of the center term of the remainder becomes a sum of the two equal numbers. That is, the center term of the remainder polynomial becomes $(P_{(n-k-1)/2}+P_{(n-k-1)/2})X^{(n-k-1)/2}$ (where, n-k is an odd number).

Since adding the two equal numbers results in "0" in the binary Galois Field as previously mentioned, the coefficient of the center term of the remainder becomes "0" normally. Thus, since the coefficient of the center term of the remainder becomes always "0" as long as no transmission error has occurred in the received CRC code, all of the inputs to the NOR gate 603a become "0," and accordingly the decision unit 603 outputs "1" to indicate error free CRC code.

According to the third embodiment of the present invention, it is not necessary to provide the switch unit 401 or 501 for switching the message bit stream and the parity bit stream separately and, thus, the CRC code error detection device becomes simpler and more compact than in the first and second embodiments.

Further, compared to the first embodiment shown in FIG. 4, the comparison unit 602 comprises fewer X-OR gates 602a, and thus configuration of the error detection device becomes even simpler.

Furthermore, compared to the second embodiment shown in FIG. 5, there is no need to co-operate the switch unit 501 with the forward and backward shift switches 503a and 503b. And, it is possible to implement the present invention simply using a convention division unit without use of the bi-directional shifting register. Thus, the structure becomes simpler. Still more, compared to the second embodiment shown in FIG. 5 adopting the sequential entire bitwise comparison scheme, the third embodiment provides a faster comparison scheme to save error detecting time.

According to the present invention, the device for and the method of detecting CRC code error described herein provides advantages in that they effectively detect the transmission errors during decoding of the received CRC code at the receiver, wherein the CRC code includes the parity bits created not by the conventional normal ordered remainder bits but by the reverse ordered remainder bits of the message bits divided by the generator polynomial.

Although the Detailed Description of the invention has been directed to certain exemplary embodiments, various modifications and variations of these embodiments will be suggested to those skilled in the art without departing from the scope or spirit of the invention. It is to be understood that the invention encompass any modifications and variations that fall within the scope of the appended claims.

What is claimed is:

1. A device for detecting errors in a CRC code, the device comprising:

a switch unit for sequentially receiving the CRC code having message bits and reverse ordered parity bits appended to the message bits and for switching the message bits and the reverse ordered parity bits to be transferred separately;

a division unit for receiving the message bits transferred via said switch unit and for dividing the message bits by a parity bit generator polynomial to obtain a remainder;

a buffer unit for receiving the reverse ordered parity bits transferred via said switch and for buffering the reverse ordered parity bits sequentially;

a comparison unit for comparing remainder bits of the remainder from said division unit with the reverse ordered parity bits from said buffer unit; and a decision unit for deciding whether transmission errors have occurred in the CRC code on the basis of the results from said comparison unit.

2. The device for detecting errors in the CRC code of claim 1, wherein said comparison unit comprises a plurality of X-OR gates for comparing the remainder bits with the reverse ordered parity bits.

3. A method for detecting errors in a CRC code comprising the steps of:

receiving CRC code having message bits and reverse ordered parity bits appended to the message bits;

dividing the message bits by a parity bit generator polynomial to form a remainder;

buffering the reverse ordered parity bits sequentially;

comparing remainder bits of the remainder with the sequentially buffered reverse ordered parity bits; and deciding whether transmission errors have occurred in the received CRC code on the basis of the results from said step of comparing.

4. A device for detecting errors in a CRC code, the device comprising:

a switch unit for sequentially receiving the CRC code having message bits and reverse ordered parity bits appended to the message bits and for switching the message bits and the reverse ordered parity bits to be transferred separately;

a division unit for receiving the message bits transferred via said switch unit and for dividing the message bits by a parity bit generator polynomial to form a remainder and for sequentially outputting remainder bits of the remainder in reverse order;

a comparison unit for comparing the reverse ordered remainder bits received sequentially from said division unit with the reverse ordered parity bits transferred sequentially via said switch unit; and a decision unit for deciding whether transmission errors have occurred in the received CRC code on the basis of the results from said comparison unit.

5. The device for detecting errors in the CRC code of claim 4, wherein said division unit comprises:

a plurality of one bit registers serially coupled with each other for storing the remainder bits of the message bits divided by the generator polynomial;

a plurality of forward shift switches for being switched to enable forward shifting of said plurality of registers until the last message bit input from said switch unit passes through said plurality of registers; and a plurality of backward shift switches for being switched to enable backward shifting of said plurality of registers so that the remainder bits stored in said plurality of registers are provided to said comparison unit sequentially.

6. The device for detecting errors in the CRC code of claim 4, wherein said comparison unit comprises an X-OR gate.

7. The device for detecting errors in the CRC code of claim 4, wherein said decision unit comprises:

an OR gate having an input for receiving the output from said comparison unit; and a delay register for receiving the output from said OR gate and for feeding back the output from said OR gate to said OR gate one clock period later.

8. A method for detecting errors in a CRC code comprising the steps of:

receiving CRC code having message bits and reverse ordered parity bits appended to the message bits;

dividing the message bits by a parity bit generator polynomial to form a remainder and for sequentially outputting remainder bits of the remainder in reverse order;

comparing the sequentially received reverse ordered remainder bits with the sequentially received reverse ordered parity bits; and deciding whether transmission error has occurred in the received CRC code on the basis of the results from said step of comparing.

9. The method for detecting errors in the CRC code of claim 8, wherein said dividing step comprises:

forward shifting the input message bits until the remainder bits are obtained; and backward shifting the remainder bits so that the remainder bits shifted out are compared sequentially in said step of comparing.

10. A device for detecting errors in a CRC code, the device comprising:

a division unit that receives and shifts input CRC code sequentially by using a plurality of one bit registers, wherein said input CRC code comprises message bits and reverse ordered parity bits appended to the message bits, and divides the message bits by a parity bit generator polynomial to form a remainder, and stores remainder bits of the remainder in said plurality of one bit registers;

a comparison unit for comparing each of a plurality of symmetrically paired counterpart bits, from the two outermost bits to the two innermost bits, of the remainder sequence stored in said plurality of registers with each other; and a decision unit for deciding whether transmission error has occurred in the input CRC code on the basis of the results from said comparison unit.

11. The device for detecting errors in the CRC code of claim 10, wherein said comparison unit comprises a plurality of X-OR gates, the number of which is as many as the integer part of the quotient of the division of the number of said plurality of registers by 2.

12. The device for detecting errors in the CRC code of claim 11, wherein if the number of said plurality of registers is odd, the center bit of the remainder stored in the center register of said plurality of registers is input directly to the decision unit.

13. A method for detecting errors in a CRC code comprising the steps of:

receiving an input CRC code sequentially, wherein said input CRC code comprises message bits and reverse ordered parity bits appended to the message bits, and dividing the message bits by a parity bit generator polynomial to form a remainder;

comparing each of a plurality of symmetrically paired counterpart bits, from the two outermost bits to the two innermost bits, of remainder bits of the remainder with each other; and deciding whether transmission error has occurred in the input CRC code on the basis of the results from said step of comparing.

14. The method for detecting errors in the CRC code of claim 13, wherein the step of deciding comprises the step of:

deciding, if the number of remainder bits is odd, whether transmission errors have occurred in the input CRC code on the basis of the results from said step of comparing and the value of the center bit of the remainder.

* * * * *